US012732195B1

(12) United States Patent
Hartin et al.

(10) Patent No.: US 12,732,195 B1
(45) Date of Patent: Sep. 8, 2026

(54) MULTI-ARRAY COHERENT RF TIMESTAMPING AND PHASE ALIGNMENT WITH RUN-TIME CLOCK PHASE ERROR CORRECTION

(71) Applicant: Raytheon Company, Tewksbury, MA (US)

(72) Inventors: Paul T. Hartin, McKinney, TX (US); Edward Escandon, Holland, MI (US); Ro Sung Ko, McKinney, TX (US)

(73) Assignee: Raytheon Company, Arlington, VA (US)

( * ) Notice: Subject to any disclaimer, the term of this patent is extended or adjusted under 35 U.S.C. 154(b) by 90 days.

(21) Appl. No.: 18/804,940

(22) Filed: Aug. 14, 2024

(51) Int. Cl.
*H03L 7/08* (2006.01)
*H04B 17/21* (2015.01)

(52) U.S. Cl.
CPC ........... *H03L 7/0807* (2013.01); *H04B 17/21* (2015.01)

(58) Field of Classification Search
CPC .............................. H03L 7/0807; H04B 17/21
See application file for complete search history.

(56) References Cited

U.S. PATENT DOCUMENTS 11,283,588 B1 * 3/2022 Behera .................. H04L 7/0016
2001/0012770 A1 8/2001 Pol
2004/0056210 A1 3/2004 Scherer
2007/0207759 A1 9/2007 Vavelidis et al.
2014/0253535 A1 * 9/2014 Lim ......................... G09G 3/20 345/213
2015/0222274 A1 * 8/2015 Cenger ............... H04L 12/6418 327/156
2022/0197330 A1 * 6/2022 Xavier .................. H03L 7/0818
2024/0007151 A1 * 1/2024 Kim ....................... H04B 7/043

* cited by examiner

*Primary Examiner* — Sam K Ahn
*Assistant Examiner* — Amneet Singh

(57) ABSTRACT

A method includes receiving a data waveform containing a network time signal embedded in the data waveform and recovering a recovered network time signal from the data waveform. The method also includes applying a first correction to the recovered network time signal to obtain a first corrected time signal. The first correction adjusts for deterministic latency associated with receiving and recovering the network time signal from the data waveform. The method further includes providing the first corrected time signal to a clock module and a phase comparator. The method further includes comparing, by the phase comparator, the first corrected time signal as output from the clock module against the recovered network time signal to obtain a local correction value. The local correction value adjusts for latency within the clock module. In addition, the method includes applying the local correction value to obtain a corrected recovered clock signal and outputting the corrected recovered clock signal.

20 Claims, 4 Drawing Sheets

300
310
Onboard Clock
230a
305
NS/VCO
IN0
IN1
OUT0
OUT1
OUT2
315
BUFFER
MGTCLK (OUT)
Phase Comparator
MGTCLK (IN)
Time keeping
CDR
235a
215a
301
Data Waveform with Embedded Network Time Signal
210
ADC/DAC
225a

400

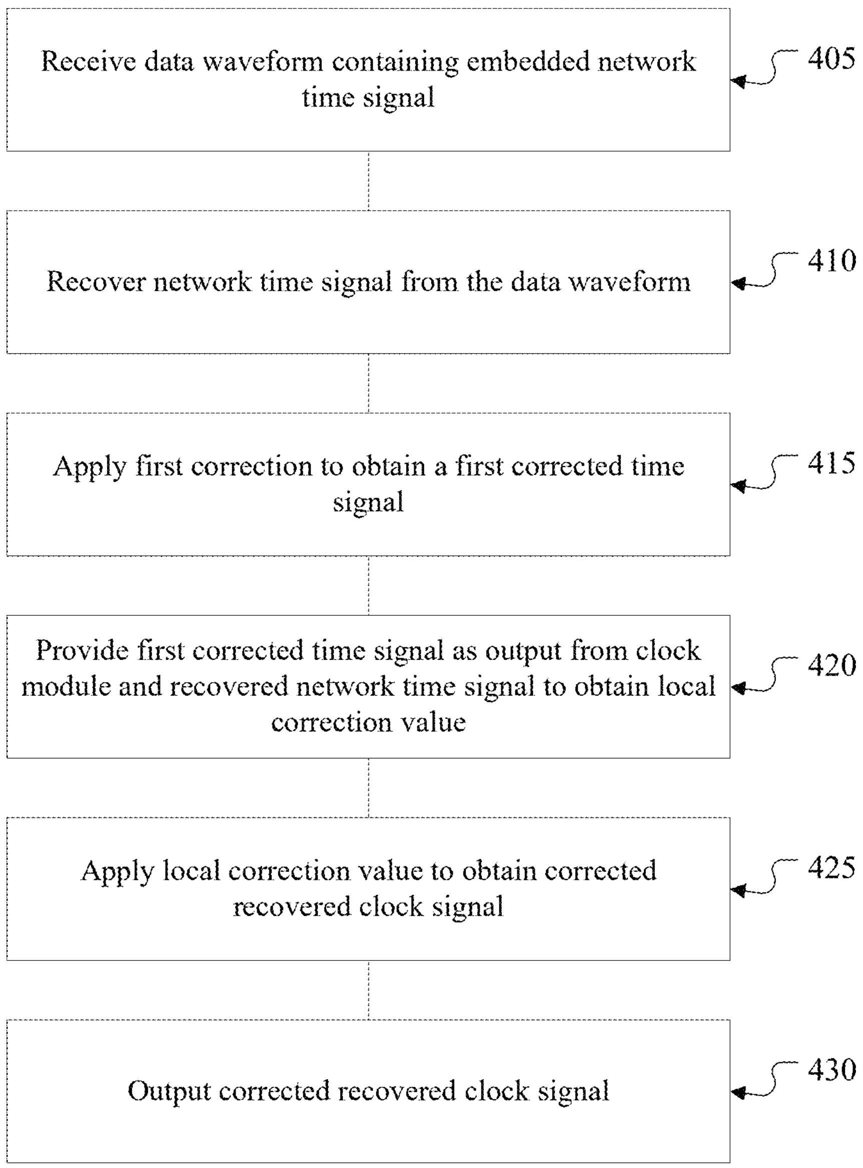

FIG. 4

Receive data waveform containing embedded network time signal
405
Recover network time signal from the data waveform
410
Apply first correction to obtain a first corrected time signal
415
Provide first corrected time signal as output from clock module and recovered network time signal to obtain local correction value
420
Apply local correction value to obtain corrected recovered clock signal
425
Output corrected recovered clock signal
430

MULTI-ARRAY COHERENT RF TIMESTAMPING AND PHASE ALIGNMENT WITH RUN-TIME CLOCK PHASE ERROR CORRECTION

TECHNICAL FIELD

This disclosure relates generally to radio frequency (RF) timekeeping and signal phasing. More specifically, this disclosure relates to multi-array coherent RF timestamping and phase alignment with run-time clock phase error correction.

BACKGROUND

Achieving coherent radio frequency (RF) signaling or managing the relative phases of multiple RF signals across multiple devices (such as a multi-antenna array) so that the phasing of signals adheres to a predetermined relationship, is a fundamental and persistent technical challenge across multiple domains. As one example, modern radio applications, including communication and radar applications, are often premised on achieving coherent RF signaling across an array of antenna elements sending or receiving high frequency signals (such as GHz signals) to perform digital beamforming and enhance the effective range of the array. Given the high frequencies of the underlying RF signals, nanosecond or sub-nanosecond phase differences may be needed to achieve digital beamforming or otherwise tune the RF signals for the given application.

SUMMARY

This disclosure relates to multi-array coherent radio frequency (RF) timestamping and phase alignment with run-time clock phase error correction.

In some embodiments, a method includes receiving, via a transceiver, a data waveform containing a network time signal embedded in the data waveform. The method also includes recovering, via a clock and data recovery ("CDR") circuit, a recovered network time signal from the data waveform. The method further includes applying a first correction to the recovered network time signal to obtain a first corrected time signal, where the first correction adjusts for deterministic latency associated with receiving and recovering the network time signal from the data waveform. The method also includes providing the first corrected time signal to a clock module and a phase comparator. The method further includes comparing, by the phase comparator, the first corrected time signal as output from the clock module against the recovered network time signal to obtain a local correction value, where the local correction value adjusts for latency within the clock module. In addition, the method includes applying the local correction value to obtain a corrected recovered clock signal and outputting the corrected recovered clock signal.

In other embodiments, an apparatus includes a transceiver configured to receive a data waveform containing a network time signal embedded in the data waveform. The apparatus also includes a CDR circuit configured to recover a recovered network time signal from the data waveform. The apparatus further includes a clock module. At least one of the clock module and the CDR circuit is configured to apply a first correction to the recovered network time signal to obtain a first corrected time signal, where the first correction adjusts for deterministic latency associated with receiving and recovering the network time signal from the data waveform. The apparatus also includes a phase comparator configured to receive the first corrected time signal as output from the clock module and a copy of the recovered network time signal as input to the clock module. The phase comparator is also configured to obtain a local correction value, where the local correction value adjusts for latency within the clock module. At least one of the clock module and a time keeping module is configured to apply the local correction value to obtain a corrected recovered clock signal. The clock module is further configured to output the corrected recovered clock signal.

Any single one or any combination of the following features may be used with the example embodiments described above. The clock module may include a network synchronizer/voltage-controlled oscillator (NS/VCO) and an onboard clock.

The NS/VCO may include a first input port connected to the onboard clock, a second input port connected to a first output port of the clock module, a first output port connected to the phase comparator, a second output port configured to output the recovered network time signal to the CDR circuit, and a third output port configured to output the corrected recovered clock signal.

The clock module may be configured to apply a second correction to remove jitter in the recovered clock signal.

The second correction may be applied to remove jitter in the recovered clock signal by receiving the recovered network time signal at a first frequency at the second input port, generating a second signal based on the network time signal at a second frequency using a phase-locked loop of the NS/VCO, determining the second correction based on a comparison of a rising edge of the recovered network time signal compared to a counterpart rising edge of the second signal, and outputting the corrected recovered clock signal at the second output port. The second frequency may be greater than the first frequency.

The NS/VCO may be configured to provide a locally-generated network time signal to the CDR circuit. The locally-generated network time signal may be based on an output of an onboard clock provided to the NS/VCO.

The CDR circuit may be configured to recover the network time signal from the data waveform using the locally-generated network time signal and to perform hitless switching from the locally-generated network time signal to the network time signal by incrementally phase-shifting the locally-generated network time signal to align with the network time signal.

The corrected recovered clock signal may be output to a first analog-to-digital converter (ADC) or digital-to-analog converter (DAC). The corrected recovered clock signal may be embedded as a first timestamp in data encoded by the first ADC or DAC. The corrected recovered clock signal may be output to a second ADC or DAC and embedded as a second timestamp in data processed by the second ADC or DAC. Digital beamforming may be performed between a first signal based on the output of the first ADC or DAC and a second signal based on the output of the second ADC or DAC, where a phase difference between the output of the first ADC or DAC and the output of the second ADC or DAC can be based on the first and second timestamps.

The first timestamp may be coherent to the network time signal.

The deterministic latency associated with receiving the data waveform and recovering the network time signal may be predetermined during factory calibration.

The onboard clock may be at a different frequency than the network time signal.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which:

FIG. 4 illustrates an example method for performing time matching to achieve coherent RF signaling according to this disclosure.

DETAILED DESCRIPTION

Figure 1:
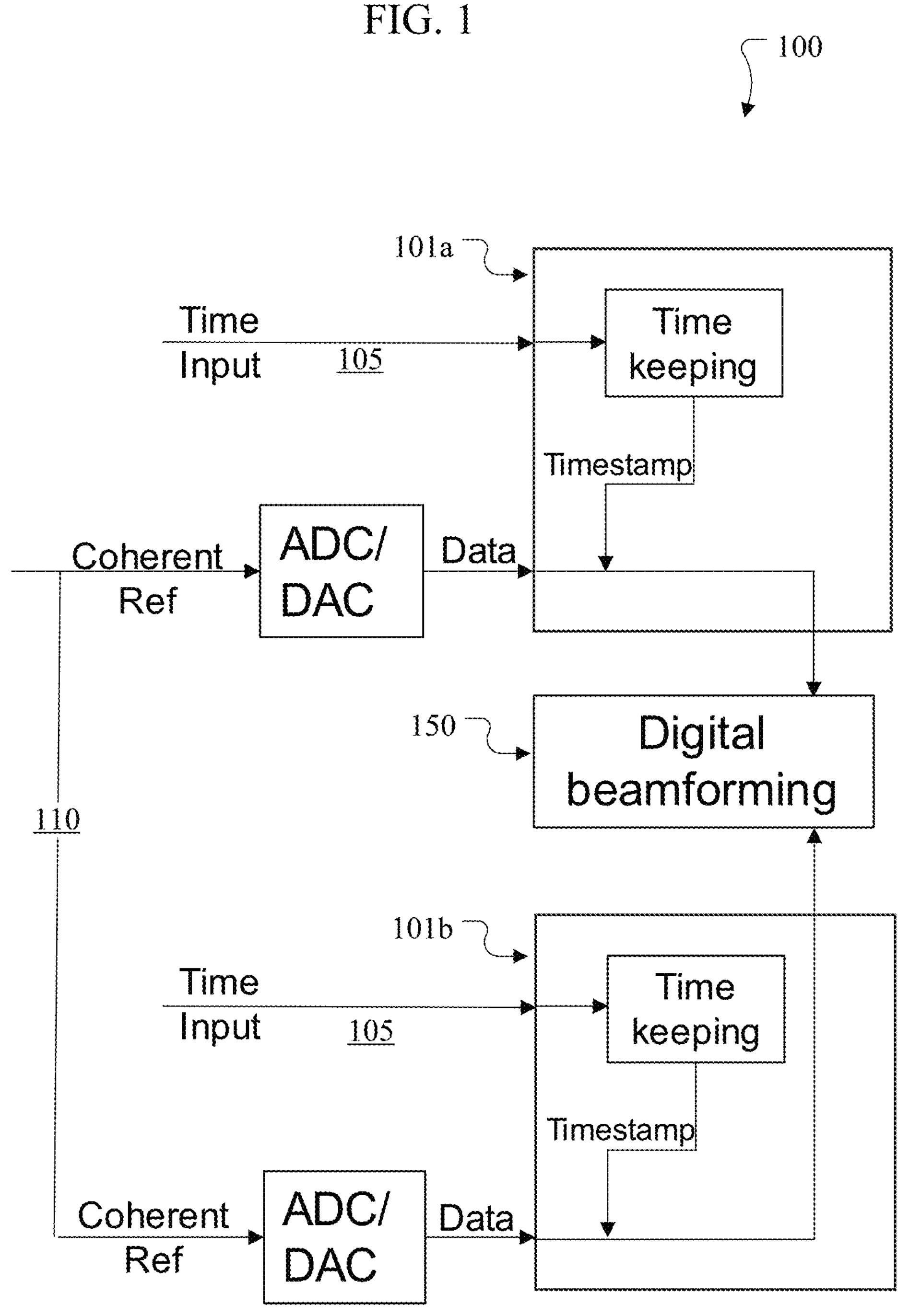
FIG. 1 illustrates an example radio frequency (RF) system using both time and phase matching to achieve coherent RF signaling.

FIGS. 1 through 4, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, achieving coherent radio frequency (RF) signaling or managing relative phases of multiple RF signals across multiple devices (such as a multi-antenna array) so that phasing of the signals adheres to a predetermined relationship is a fundamental and persistent technical challenge across multiple domains. As one example, modern radio applications, including communication and radar applications, are often premised on achieving coherent RF signaling across an array of antenna elements sending or receiving high frequency signals (such as GHz signals) to perform digital beamforming and enhance the effective range of the array. Given the high frequencies of the underlying RF signals, nanosecond or sub-nanosecond phase differences may be needed to achieve digital beamforming or otherwise tune the RF signals for the given application.

While it is possible to achieve coherent RF by feeding a reference signal from a master device to each device over a plurality of links, this approach presents size, weight, and power ("SWAP") penalties associated with the multiple links passing the reference signal. For example, a system may need to account for temperature and material effects specific to each link, since these effects can create phase differentials across links. Thus, in such systems, the granularity with which multiple RF signals can be made coherent is limited by how well the reference signals provided over links can be synchronized. Improved synchronization is typically associated with greater weight, power consumption, and complexity associated with closer monitoring and correction of factors such as temperature differences that would otherwise confound the synchronization of instances of a reference signal across multiple physical links.

Implementing RF phase tuning based on synchronized clocks running at each device, rather than through the use of a coherent reference signal provided over a plurality of physical links, appears to present intriguing opportunities for relieving the SWAP penalties associated with maintaining, monitoring, and adjusting for phasing changes across multiple links, as well as opportunities for more granular (such as picosecond level) control of phase differences. However, realizing theoretical performance improvements associated with phasing RF signals based on a plurality of local clocks depends significantly on the extent to which multiple local clocks can be mutually synchronized and how corrections for device-specific latencies occur. Implementing digital beamforming and other technologies premised on coherent RF across a plurality of devices depends significantly achieving accurate time alignment across the devices.

FIG. 1 illustrates an example RF system 100 using both time and phase matching to achieve coherent RF signaling. Referring to FIG. 1, the RF system 100 achieves RF coherency based upon time matching and phase matching. In this example, RF system 100 includes a first device 101*a* and a counterpart second device 101*b*. In this example, first and second devices 101*a* and 101*b* include transmit and receive (Tx/Rx) circuitry for a digital beamforming radio array 150 such that the directionality of one or more radio beams transmitted is a function of a phase difference between a first signal provided to a first antenna connected to first device 101*a* and a second signal provided to a second antenna connected to second device 101*b*. In this example, both first device 101*a* and second device 101*b* receive a time signal 105, which is the time at a master clock from which time keeping circuitry in each of first device 101*a* and second device 101*b* can timestamp data to be transmitted. Using the timestamps, the transmission circuitry can implement granular (such as occurring in less time than a full wave cycle) phase level differences in the transmission times at first device 101*a* and second device 101*b*. Because first device 101*a* and second device 101*b* receive time signal 105, they are said to be "time-aligned."

Because time signal 105 is provided from a master clock to each of first device 101*a* and second device 101*b* without any correction for local latencies at each device, there is no innate guarantee that, for a given instant, the timestamp applied by first device 101*a* matches a counterpart timestamp applied by second device 101*b*. Variations in local latency between first device 101*a* and second device 101*b* can confound the synchronization of the local time values at first device 101*a* and second device 101*b*. The aforementioned variations in local time values between first device 101*a* and second device 101*b* impose limits on the precision and granularity with which the relative phases of signals transmitted or received by first device 101*a* and second device 101*b* can be modulated or measured. As the size of the variations in local time values across devices approaches the size of the applied or measured phase differentials, achieving RF coherency becomes increasingly difficult.

Because time alignment in RF system 100 is, by itself, insufficient to reliably ensure sufficient time synchronization for coherent RF, a reference signal 110 is provided to each of devices 101*a* and 101*b* to further synchronize local time values. Reference signal 110 is provided to each of first device 101*a* and second device 101*b* over either physical or radio links, which are actively monitored and corrected to ensure that the instance of reference signal 110 provided to first device 101*a* is in phase with the instance of reference signal 110 provided to second device 101*b*. By receiving and synchronizing time stamps based on reference signal 110, first and second devices 101*a* and 101*b* are also said to be phase matched.

As noted elsewhere in this disclosure, implementing phase matching can impose significant SWAP penalties associated with maintaining links for providing reference signal 110 to each of first device 101*a* and second device 101*b* and correcting for sources (such as temperature effects) of localized variation in the phasing of the instances of reference signal 110. In practical terms, the SWAP penalties associated with synchronizing and managing phase variations across instances of a reference signal translate into limits on the performance envelope over which RF coherency can be attained at digital beamforming array 150. For example, where first and second devices 101*a* and 101*b* are part of larger systems that float or fly, there are clear and finite limits to the amount of payload and available power that can be dedicated to systems for optimizing reference signal 110.

Figure 2:
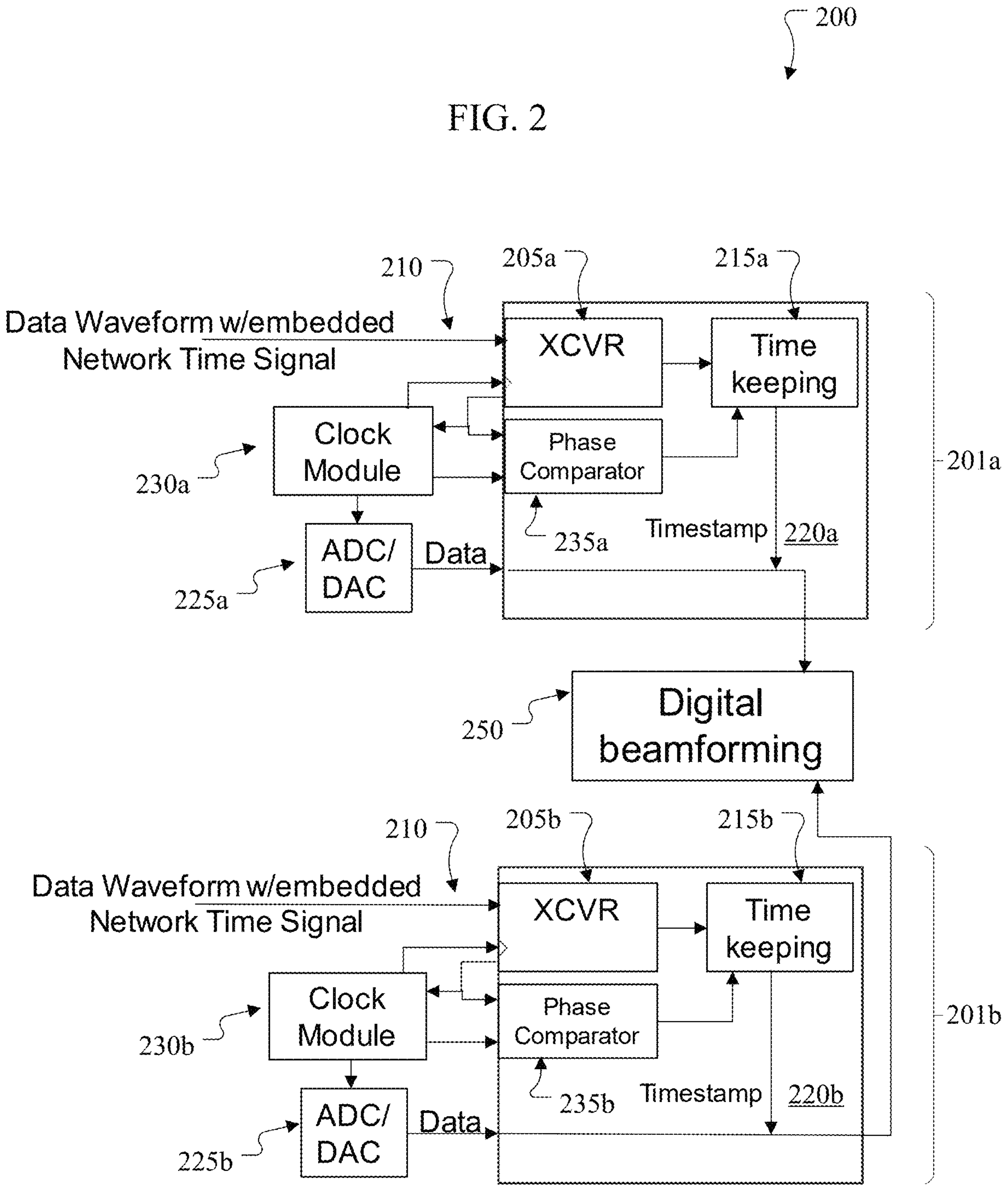
FIG. 2 illustrates an example RF system using time matching to achieve coherent RF signaling according to this disclosure.

FIG. 2 illustrates an example RF system 200 using time matching to achieve coherent RF signaling according to this disclosure. In contrast to RF system 100 in FIG. 1, RF system 200 dispenses with enforced reliance upon providing a synchronized phase signal (for example, reference signal 110) to achieve RF coherency. Thus, while the hardware for synchronizing a reference signal (such as reference signal 110 in FIG. 1) may be used in combination with RF system 200, such hardware is not strictly necessary and can be removed (or disabled when not in use) to realize SWAP savings or performance gains from improved phase matching according to this disclosure.

RF system 200 includes a first device 201*a* and a second device 201*b* employing a common architecture. First device 201*a* is connected to a first antenna of an antenna array, and second device 201*b* is connected to a second antenna of the antenna array. First device 201*a* and second device 201*b* implement synchronized local clocks keyed off of a network time signal embedded in data waveforms transmitted to devices 201*a* and 201*b*, where local clocks at first device 201*a* and 201*b* correct for the deterministic latency associated with receiving a data waveform and recovering the network time signal from the received data waveform, as well as local latencies specific to each of first device 201*a* and second device 201*b*.

Provided the corrections for local latency are correctly and consistently applied, time values generated from the network time signal as recovered at first device 201*a* and time values generated from the network time signal as recovered at second device 201*b* will be synchronized and aligned to one another. Equally importantly, the local clocks at devices 201*a* and 201*b* remain synchronized and aligned to one another, even if the network time signal embedded in the received data varies. Errors in the embedded network time signal can be propagated identically to each of first and second devices 201*a* and 201*b* and thus do not affect RF coherency between first device 201*a* and second 201*b*.

Skilled artisans will appreciate that the configuration shown in FIG. 2 is illustrative of, rather than limitative of, embodiments according to this disclosure and that other implementations in which RF coherency is achieved by synchronizing local clocks through time matching are possible and within the contemplated scope of this disclosure. This disclosure is not limited to systems which perform digital beamforming based on modulating the phase of only two signals.

For consistency and convenience of cross-reference, elements common to the mirrored systems of devices 201*a* and 201*b* are numbered similarly, with the instances of common devices distinguished by "a" and "b." Referring to the example of FIG. 2, first and second devices 201*a* and 201*b* include transceivers 205*a* and 205*b*, respectively, where each transceiver 205*a* and 205*b* is configured to receive data as a waveform in which a network time signal 210 is embedded in and can be recovered from the waveform. Network time signal 210 can be a signal (such as a square wave) produced by a master clock with rising and falling edges occurring at a first known frequency. Further, the latency associated with receiving the data waveform and recovering network time signal 210 from the data waveform is deterministic and can be measured during factory calibration of first and second transceivers 205*a* and 205*b*. Additionally or alternatively, the latency associated with receiving and recovering network time signal 210 from the data waveform can be pre-calculated.

Depending on the configuration, first and second transceivers 205*a* and 205*b* can include clock and data recovery ("CDR") circuits, which are configured to recover, from the data waveform received at the transceivers, an initial version of the network time signal embedded in the data waveform. Additionally, or alternatively, first and second devices 201*a* and 201*b* may have standalone CDR circuits. To recover network time signal 210, the CDR circuits can use a reference signal having the same frequency as network time signal 210. Accordingly, at startup, each of first and second devices 201*a* and 201*b* may use a locally-generated reference signal from an onboard clock to recover network time signal 210 and subsequently switch over to using currently-recovered network time signal 210 as the reference signal for continuing to recover network time signal 210. Once first and second devices 201*a* and 201*b* are up and running and corrections for deterministic and local latencies have been performed, the recovered network time signal 210 provides a common temporal heartbeat between first and second devices 201*a* and 201*b* for realizing coherent RF signaling.

First and second devices 201*a* and 201*b* also include first- and second-time keeping modules 215*a* and 215*b*, respectively. First and second time keeping modules 215*a* and 215*b* handle determining time values from the recovered network time signal 210. By analogy to mechanical timepieces, recovered network time signal 210 acts as the pendulum or foliot balance that marks out temporal increments, and first- and second-time keeping modules 215*a* and 215*b* are analogous to the movement, face, and other components that add and translate the measured increments of time into reported time values. As shown here, first and second time keeping modules 215*a* and 215*b* provide timestamps 220*a* and 220*b* that, in combination with embedded time data in data passing through first and second analog-to-digital/digital-to-analog converters 225*a* and 225*b*, can determine the timing at which the data is transmitted by antennas of digital beamforming array 250.

First and second devices 201*a* and 201*b* further include first and second clock modules 230*a* and 230*b*, respectively. As discussed in greater detail with reference to FIG. 3, first and second clock modules 230*a* and 230*b* can "clean up" and reduce jitter in the recovered network time signal and/or perform hitless switching to transition first and second devices 201*a* and 201*b* from being synchronized to an internally-generated clock signal to network time signal 210.

In addition, first and second devices 201*a* and 201*b* include first and second phase comparators 235*a* and 235*b*, respectively. First and second phase comparators 235*a* and 235*b* are configured to perform a comparison between two separate instances of the recovered network clock signal to determine additional locally-caused latency arising in clock modules 230*a* and 230*b*. Depending on the embodiments, these components of each of first and second devices 201*a* and 201*b* can be embodied on a single chip or circuit board or across a plurality of components. The form factor and specific components of first and second devices 201*a* and 201*b* can vary across embodiments and the weight and power restrictions of the given application. For example, first and second devices 201*a* and 201*b* can each be implemented as a system on a chip, a microcontroller, or a field programmable gate array.

First device 201*a* can be configured to recover a network time signal 210 and correct the recovered network time signal for both deterministic and instance-specific latency with sufficient precision to achieve coherent RF signaling with other devices similarly synchronized to the network time signal 210 as follows. Note that second device 201*b* can operate in the same or similar manner.

During run-time (such as after start-up), first device 201*a* receives, via first transceiver 205*a*, a data waveform in which network time signal 210 is embedded. Network time signal 210 can be a regularly repeating signal having a discernable phase (such as a square wave). Network time signal 210 is recovered from the received data waveform using, for example, a CDR circuit provided by first device 201*a*. Once a network time signal 210 is recovered from the data waveform, a first correction for the deterministic (such as a known or reliably-predictable) latency associated with receiving the data waveform in which network time signal 210 is embedded and recovering network time signal 210 from the data waveform. By applying a first correction for deterministic latency, a first corrected time signal can be obtained. As shown in FIG. 2, in first device 201*a*, clock module 230*a* outputs clock values for data for transmission passing through ADC/DAC 225*a*. Given the possibility of clock module 230*a* introducing minor, local, and device-specific perturbations in the phasing of the first corrected time signal prior to output, a copy of the first corrected time signal as output from clock module 230*a* is provided to phase comparator 235*a* for comparison against a copy of the first corrected time signal prior to being input to clock module 230*a*. To the extent phase comparator 235*a* shows a phase differential created in clock module 230*a*, a second local correction is applied to offset local phase effects introduced in clock module 230*a*. After applying the second correction for phase effects arising in clock module 230*a*, a corrected recovered clock signal is output, such as to ADC/DAC 225 or through time keeping module 215*a*, for transmission by digital beamforming array 250. In some cases, the corrected recovered clock signal can be used in applications requiring or desiring RF coherency.

While the operation of first and second devices 201*a* and 201*b* have been described with reference to synchronizing clocks to achieve RF coherency for digital beamforming of transmitted signals, embodiments according to this disclosure are not so limited. Additionally, or alternatively, time values obtained from the corrected recovered clock can be used to timestamp arrival times for signals coming into first device 201*a*, such as for comparison against transmission times or arrival times at second device 201*b* to determine one or more of a time of flight or a direction of reception. This disclosure should not be construed as being limited to establishing RF coherency for digital beamforming of transmissions.

As noted elsewhere here, startup and initiation of the process of recovering network time signal 210 presents technical challenges in that recovering network time signal 210 from a data waveform can involve the use of a reference signal at the same frequency as network time signal 210. Accordingly, as described here, embodiments according to this disclosure can address these challenges by using a locally-generated reference signal at startup to initiate recovery of network time signal 210 and then performing hitless switching to transition to using the recovered network time signal as the reference signal for continued recovery of network time signal 210.

Abrupt switching from a locally-generated time signal as a reference signal for recovering network time signal 210 at startup to feeding back network time signal 210 as the reference signal for its continued recovery at run time presents the risk of "phase jumps" in which the "implied beat" of network time signal 210 is lost or sent 180° out of phase during the switchover. To avoid the risk of phase jumps or other phasing errors during the handover from a locally-generated reference signal to the recovered network time signal as the reference signal for recovering network time signal 210, clock modules according to this disclosure may perform hitless switching.

Figure 3:
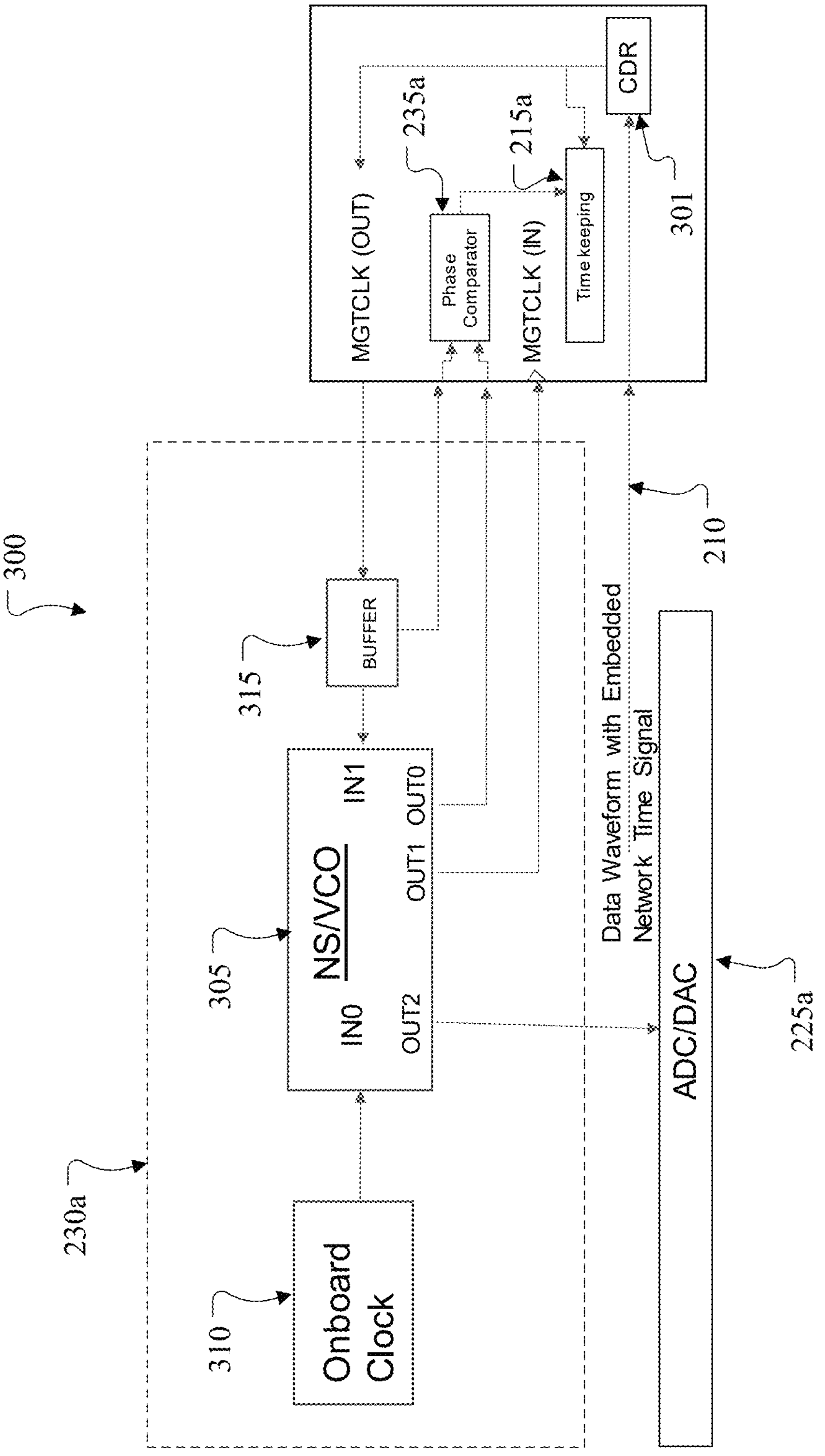
FIG. 3 illustrates an example device using time matching to achieve coherent RF signaling according to this disclosure.

FIG. 3 illustrates an example device 300 using time matching to achieve coherent RF signaling according to this disclosure. More specifically, FIG. 3 illustrates an example device 300 including a clock module 230*a* that maintains an onboard clock and locally-generated waveform as well as a network synchronizer/voltage-controlled oscillator for performing hitless switching to transition device 300 away from using the locally-generated waveform as the reference signal for recovering network time signal 210. For convenience and consistency of cross-reference, elements of device 300 described or introduced in reference to FIG. 2 are numbered similarly.

As shown in FIG. 3, clock module 230*a* can include a network synchronizer/voltage-controlled oscillator (NS/VCO) 305, an onboard clock 310, and a splitter/buffer 315. Onboard clock 310 can include an oscillator and a clock generator, which together output a locally-generated network time signal. The locally-generated network time signal can be a waveform (such as a square wave) of equivalent or proportional (such as ½, ¼, or ⅛) frequency to that of network time signal 210.

NS/VCO 305 can be implemented as a single device (such as by using a TEXAS INSTRUMENTS LMK5B33414 device) or as a combination of components. NS/VCO 305 includes a first input port (shown as IN0) configured to receive the locally-generated network time signal from onboard clock 310. NS/VCO 305 also includes a second input port (shown as IN1) connected to an output port (shown as MGTCLK (OUT)) that outputs the first corrected time signal (such as the recovered network clock after application of the first correction for deterministic latency). NS/VCO 305 further includes a first output port (shown as OUT(0)) that outputs the first corrected time signal to phase comparator 235*a*, which performs a comparison of the phasing between the first corrected time signal going into NS/VCO 305 relative to the first corrected time signal coming out of NS/VCO 305 to determine whether the outputs of NS/VCO 305 require a second correction for phase changes created by NS/VCO 305. In addition, NS/VCO 305 includes a second output port (shown as OUT1) that outputs the first corrected time signal to CDR circuit 301 as the timing signal for recovering network time signal 210 from the data waveform. Finally, NS/VCO 305 includes a third output port (shown as OUT2) that outputs the corrected recovered clock signal to ADC/DAC 225*a* to provide time values for one or more downstream applications, such as coherent RF like digital beamforming or timestamping arrival times of received signals to determine time of flight.

As noted elsewhere, because CDR circuit 301 is configured to feed back and use recovered network time signal 210 for continued recovery of network time signal 210 at run-time, another signal may be used to initially recover network time signal 210. As such, at startup, a locally-generated clock signal generated at onboard clock 310 is provided to NS/VCO 305 and output via the second output port (OUT (1)) to CDR circuit 301 to recover network time signal 210. After that, the recovered network time signal is fed, via splitter/buffer 315, to the second input port of NS/VCO 305. While it is possible to perform a "hard switch" by abruptly changing from IN0 to IN1 as the source of the clock signal provided to CDR circuit 301 via the second output port (OUT1), doing so can create "phase jumps."

To avoid the risk of phasing errors associated with making a hard switch between IN0 and IN1 as the source of the reference signal for recovering network time signal 210, NS/VCO 305 implements a phase locked loop (PLL) based on the signal received from onboard clock 310, where the phase locked loop provides a higher frequency signal that is in phase with the signal from onboard clock 310. Using the PLL, iteratively phase shifted copies of the signal from onboard clock 310 can be made and output, via the second output port, to CDR circuit 301 until the phase-shifted copies align with recovered network time signal 210. At this point, the switch from onboard clock 310 to recovered network time signal 210 as the clocking signal for recovering network time signal 210 from the data waveform can be performed without any risk of phase jump. Additionally, or alternatively, hitless switching can be performed by tuning the PLL based on the signal from onboard clock 310 to a frequency which is either slightly higher or slightly lower than that of recovered time signal 210. After a period of time, the two signals will be in phase with each other, and the PLL can be switched to the frequency of recovered time signal 210 in preparation for a smooth transfer to recovered time signal 210.

Additionally, NS/VCO 305 can implement a phase locked loop to remove jitter in recovered network time signal 210 during run time. As noted elsewhere, the network time signal embedded in data waveforms sent to devices according to this disclosure can vary or be slightly perturbed without loss of RF coherency, provided all of the devices are synced to the same variations in the network time signal. To facilitate such synchronization in the face of slight variations in the network time signal and potential jitters in the output of the components implementing time keeping module 215*a*, CDR circuit 301, and phase comparator 235*a*, the same types of iterative corrections based on the higher frequency waveform provided by the PLL can be performed to prevent slight variations in the network time signal or jitters or other noise from internal components from creating "phase jump" (such as 180°) shifts in the recovered network time signal.

FIG. 4 illustrates an example method 400 for performing time matching to achieve coherent RF signaling according to this disclosure. The operations described with reference to FIG. 4 can be performed at any suitably-configured apparatus, such as the apparatus described with reference to FIGS. 2 and 3. While the following description assumes that the method 400 is performed using the first device 201*a*, the method 400 may be performed using any other or additional devices, such as the second device 201*b*.

At operation 405, an apparatus including a transceiver (such as transceiver 205*a*) receives a data waveform (such as a square wave) associated with a suitable bandwidth (for example, 6 gigasamples per second ("GSPS")) containing an embedded network time signal multiplexed within the data waveform. In some cases, the data waveform may include both data and metadata regarding the timing of transmitting the data to create a phase offset to provide digital beamforming. At operation 410, the embedded network time signal is recovered by a clock and data recovery circuit (such as CDR circuit 301 in FIG. 3) in the apparatus. As operations 405 and 410 may not be performed instantaneously, there can be some deterministic latency associated with the operation of the circuitry that receives and recovers the network time signal. In some cases, such deterministic latency can be pre-calculated or measured during factory calibration of the apparatus. At operation 415, a first correction is applied to offset the effects of such deterministic latency. The first correction can be applied as one or more of an adjustment to time stamps and reported time values output by a time keeping module (such as time keeping module 215*a*) or as a phase correction implemented by the clock module.

At operation 420, two versions of the first corrected time signal obtained at operation 415 are fed to a phase comparator (such as phase comparator 235*a*) to determine a local correction value to offset for latency or phase effects arising in the clock module. A first version of the first corrected time signal fed to the phase comparator may include a copy of the first corrected time signal as input to the clock module (such as the signals output by splitter/buffer 315 in FIG. 3), and a second version of the first corrected time signal fed to the phase comparator may include the first corrected time signal as output by the clock module (such as the signals output at ports OUT1 and OUT0 of NS/VCO 305). Based on the phase differential, if any, between the two instances of the first corrected time signal, a local correction value is obtained. At operation 425, the local correction value determined at operation 420 is applied to the first corrected time signal to account for additional non-deterministic latencies associated with operation of the clock module. Again, the local correction value can be applied as one or more of a phase shift to the first corrected time signal or an offset value applied by the time keeping module to time values output by the time keeping module.

At operation 430, the corrected recovered clock signal is output to provide a synchronized reference time. In some embodiments, the recovered clock signal is output through the time keeping module 215*a* and an ADC/DAC as a time stamp associated with the transmission or receipt time of a data transmission.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:

receiving, via a transceiver, a data waveform containing a network time signal embedded in the data waveform;

recovering, via a clock and data recovery ("CDR") circuit, the network time signal from the data waveform to generate a recovered network time signal;

applying a first correction to the recovered network time signal to obtain a corrected time signal, wherein the first correction adjusts for deterministic latency associated with receiving and recovering the network time signal from the data waveform;

providing the corrected time signal to a clock module and a phase comparator, the clock module outputting the corrected time signal;

comparing, by the phase comparator, the corrected time signal as output from the clock module against the recovered network time signal to obtain a local correction value, wherein the local correction value adjusts for latency within the clock module;

applying the local correction value to obtain a corrected recovered clock signal; and outputting the corrected recovered clock signal.

2. The method of claim 1, wherein:

the clock module comprises a network synchronizer/voltage-controlled oscillator (NS/VCO) and an onboard clock; and the NS/VCO comprises a first input port connected to the onboard clock, a second input port connected to the CDR circuit, a first output port connected to the phase comparator, a second output port configured to output the corrected time signal to the CDR circuit, and a third output port configured to output the corrected recovered clock signal.

3. The method of claim 2, further comprising:

applying, by the clock module, a second correction to remove jitter in the corrected recovered clock signal.

4. The method of claim 3, wherein applying the second correction comprises:

receiving the recovered network time signal at a first frequency at the second input port;

generating a second signal at a second frequency using a phase-locked loop of the NS/VCO, wherein the second frequency is greater than the first frequency; and determining the second correction based on a comparison of a rising edge of the recovered network time signal compared to a counterpart rising edge of the second signal.

5. The method of claim 2, further comprising:

providing, by the NS/VCO, a locally-generated network time signal to the CDR circuit, wherein the locally-generated network time signal is based on an output of the onboard clock provided to the NS/VCO;

recovering, by the CDR circuit, the network time signal from the data waveform using the locally-generated network time signal; and performing hitless switching from the locally-generated network time signal to the recovered network time signal by incrementally phase-shifting the locally-generated network time signal to align with the recovered network time signal.

6. The method of claim 1, wherein:

the corrected recovered clock signal is output to a first analog-to-digital converter (ADC) or digital-to-analog converter (DAC); and the corrected recovered clock signal is embedded as a first timestamp in data encoded by the first ADC or DAC.

7. The method of claim 6, wherein:

the corrected recovered clock signal is output to a second ADC or DAC and embedded as a second timestamp in data processed by the second ADC or DAC;

the method further comprises performing digital beamforming between a first signal based on the output of the first ADC or DAC and a second signal based on the output of the second ADC or DAC; and a phase difference between the output of the first ADC or DAC and the output of the second ADC or DAC is based on the first and second timestamps.

8. The method of claim 6, wherein the first timestamp is coherent to the network time signal.

9. The method of claim 1, wherein the deterministic latency associated with receiving the data waveform and recovering the network time signal is predetermined during factory calibration.

10. The method of claim 5, wherein the onboard clock has a different frequency than the network time signal.

11. An apparatus comprising:

a transceiver configured to receive a data waveform containing a network time signal embedded in the data waveform;

a clock and data recovery ("CDR") circuit configured to recover the network time signal from the data waveform to generate a recovered network time signal;

a clock module, wherein at least one of the clock module and the CDR circuit is configured to apply a first correction to the recovered network time signal to obtain a corrected time signal, wherein the first correction adjusts for deterministic latency associated with receiving and recovering the network time signal from the data waveform; and a phase comparator configured to receive the corrected time signal as output from the clock module and a copy of the recovered network time signal as input to the clock module, the phase comparator also configured to obtain a local correction value, wherein the local correction value adjusts for latency within the clock module;

wherein at least one of the clock module and a time keeping module is configured to apply the local correction value to obtain a corrected recovered clock signal; and wherein the clock module is further configured to output the corrected recovered clock signal.

12. The apparatus of claim 11, wherein:

the clock module comprises a network synchronizer/voltage-controlled oscillator (NS/VCO) and an onboard clock; and the NS/VCO comprises a first input port connected to the onboard clock, a second input port connected the CDR circuit, a first output port connected to the phase comparator, a second output port configured to output the corrected time signal to the CDR circuit, and a third output port configured to output the corrected recovered clock signal.

13. The apparatus of claim 12, wherein the clock module is further configured to apply a second correction to remove jitter in the corrected recovered clock signal.

14. The apparatus of claim 13, wherein, to apply the second correction, the clock module is configured to:

receive the recovered network time signal at a first frequency at the second input port;

generate a second signal at a second frequency using a phase-locked loop of the NS/VCO, wherein the second frequency is greater than the first frequency; and determine the second correction based on a comparison of a rising edge of the recovered network time signal compared to a counterpart rising edge of the second signal.

15. The apparatus of claim 12, wherein the clock module is further configured to:

provide a locally-generated network time signal to the CDR circuit, wherein the locally-generated network time signal is based on an output of the onboard clock provided to the NS/VCO;

recover, by the CDR circuit, the network time signal from the data waveform using the locally-generated network time signal; and perform hitless switching from the locally-generated network time signal to the recovered network time signal by incrementally phase-shifting the locally-generated network time signal to align with the recovered network time signal.

16. The apparatus of claim 11, wherein:

the clock module is configured to output the corrected recovered clock signal to a first analog-to-digital converter (ADC) or digital-to-analog converter (DAC); and the corrected recovered clock signal is embedded as a first timestamp in data encoded by the first ADC or DAC.

17. The apparatus of claim 16, wherein:

the clock module is configured to output the corrected recovered clock signal to a second ADC or DAC that is configured to embed the corrected recovered clock signal as a second timestamp in data processed by the second ADC or DAC;

the apparatus is configured to be connected to a transmitter that is configured to perform digital beamforming between a first signal based on the output of the first ADC or DAC and a second signal based on the output of the second ADC or DAC; and a phase difference between the output of the first ADC or DAC and the output of the second ADC or DAC is based on the first and second timestamps.

18. The apparatus of claim 16, wherein the first timestamp is coherent to the network time signal.

19. The apparatus of claim 11, wherein the deterministic latency associated with receiving the data waveform and recovering the network time signal is predetermined during factory calibration.

20. The apparatus of claim 15, wherein the onboard clock has at a different frequency than the network time signal.

* * * * *